United States Patent
Tokusaki et al.

(10) Patent No.: US 9,945,887 B2
(45) Date of Patent: Apr. 17, 2018

(54) MEASURING APPARATUS AND MEASURING METHOD

(71) Applicant: OMRON Corporation, Kyoto-shi, Kyoto (JP)

(72) Inventors: Hiroyuki Tokusaki, Kyoto (JP); Hiroshi Imai, Kyoto (JP); Yasukazu Ohno, Kyoto (JP); Keiki Matsuura, Kyoto (JP)

(73) Assignee: OMRON Corporation, Kyoto (JP)

( * ) Notice: Subject to any disclaimer, the term of this patent is extended or adjusted under 35 U.S.C. 154(b) by 203 days.

(21) Appl. No.: 14/776,840

(22) PCT Filed: Jan. 22, 2014

(86) PCT No.: PCT/JP2014/051186
§ 371 (c)(1),
(2) Date: Sep. 15, 2015

(87) PCT Pub. No.: WO2014/141746
PCT Pub. Date: Sep. 18, 2014

(65) Prior Publication Data
US 2016/0025778 A1    Jan. 28, 2016

(30) Foreign Application Priority Data

Mar. 15, 2013   (JP) .................................. 2013-052982

(51) Int. Cl.
*G01R 15/18*   (2006.01)
*G01R 19/00*   (2006.01)
*G01R 21/00*   (2006.01)

(52) U.S. Cl.
CPC ............ *G01R 15/18* (2013.01); *G01R 19/00* (2013.01); *G01R 19/0092* (2013.01); *G01R 21/00* (2013.01)

(58) Field of Classification Search
CPC ..... G01R 15/18; G01R 21/00; G01R 19/0092; G01R 19/00
See application file for complete search history.

(56) References Cited

U.S. PATENT DOCUMENTS 3,260,976 A * 7/1966 Eissmann ............. H01F 27/427
336/150
4,196,387 A * 4/1980 Watabe .................. G01R 19/22
324/107

(Continued)

FOREIGN PATENT DOCUMENTS

CN           1395359 A     2/2003
CN         201392362 Y     1/2010

(Continued)

OTHER PUBLICATIONS

Extended European Search Report in counterpart European Application No. 14 76 2751.7 dated Jan. 30, 2017 (7 pages).

(Continued)

*Primary Examiner* — Patrick Assouad
*Assistant Examiner* — Demetrius Pretlow
(74) *Attorney, Agent, or Firm* — Osha Liang LLP

(57) ABSTRACT

A measuring apparatus has a physical amount transformer that transforms a physical amount into a current, a measuring circuit that measures an output current of the physical amount transformer, a power supply circuit that inputs an output of the measuring circuit, a circuit switching unit that switches between a first state and a second state, the first state constituting a circuit inputting the output of the measuring circuit into the power supply circuit, the second state constituting a circuit directly inputting the output of the measuring circuit into the physical amount transformer, and a switching controller driven by the power supply circuit to control the circuit switching unit.

19 Claims, 12 Drawing Sheets

(56) References Cited

U.S. PATENT DOCUMENTS

| | | | |
|---|---|---|---|
| 7,626,378 B1 | 12/2009 | Fest | |
| 2011/0291488 A1 | 12/2011 | Paik et al. | |
| 2012/0084029 A1* | 4/2012 | Kang | G01R 21/133 |
| | | | 702/61 |
| 2013/0151184 A1 | 6/2013 | Rossi et al. | |
| 2013/0278243 A1* | 10/2013 | Chen | G01R 19/0092 |
| | | | 324/127 |

FOREIGN PATENT DOCUMENTS

| | | |
|---|---|---|
| CN | 101926083 A | 12/2010 |
| CN | 102565657 A | 7/2012 |
| JP | 10-75323 A | 3/1998 |
| JP | 2000-065867 A | 3/2000 |
| JP | 2002-131344 A | 5/2002 |
| JP | 2004-516458 A | 6/2004 |
| JP | 2010-055356 A | 3/2010 |

OTHER PUBLICATIONS

International Search Report issued in corresponding application No. PCT/JP2014/051186 dated Apr. 22, 2014 (2 pages).
Office Action in counterpart Korean Patent Application No. 10-2015-7024796 dated Jan. 17, 2017 (9 pages).
Office Action in counterpart Chinese Patent Application No. 201480012921.8 dated Jan. 24, 2017 (5 pages).

* cited by examiner

MEASURING APPARATUS AND MEASURING METHOD

BACKGROUND

Technical Field

The present invention relates to a measuring apparatus and a measuring method, particularly to a measuring apparatus, which includes a measuring circuit measuring current and uses the current as electric power, and a measuring method.

Related Art

Conventionally, there is a measuring apparatus in which the current is taken out with a CT (Current Transformer) and measured. For example, the measuring apparatus is used to measure power consumption of an electric facility.

In the measuring apparatus disclosed in Japanese Unexamined Patent Publication Nos. 2002-131344 (Patent Document 1) and 2010-55356 (Patent Document 2), output current of the CT is used as the electric power. Therefore, necessity of wiring in the apparatus is eliminated, so that the power consumption can finely be measured in each electric facility.

Patent Document 1: Japanese Unexamined Patent Publication No. 2002-131344

Patent Document 2: Japanese Unexamined Patent Publication No. 2010-55356

SUMMARY OF THE INVENTION

However, in the case that the measuring circuit measuring the current is connected to a power supply circuit, accuracy of current measurement degrades compared with the case that the measuring circuit is not connected to the power supply circuit.

A measuring apparatus according to one or more embodiments of the present invention and a measuring method according to one or more embodiments of the present invention may accurately measure current.

According to one or more embodiments of the present invention, a measuring apparatus includes: a physical amount transformer configured to transform a physical amount into a current; a measuring circuit configured to measure an output current of the physical amount transformer; a power supply circuit configured to input an output of the measuring circuit; a circuit switching unit configured to switch between a first state and a second state, the first state constituting a circuit inputting the output of the measuring circuit into the power supply circuit, the second state constituting a circuit directly inputting the output of the measuring circuit into the physical amount transformer; and a switching controller driven by the power supply circuit to control the circuit switching unit. The switching controller controls the circuit switching unit such that the circuit switching unit is in the first state during waiting, and the switching controller controls the circuit switching unit such that the circuit switching unit is in the second state during measurement.

According to one or more embodiments of the present invention, a measuring apparatus includes: a physical amount transformer configured to transform a physical amount into a current, the physical amount transformer including a connection portion used to take out an alternating current; first and second rectifier circuits configured to rectify the alternating current passed through the connection portion into a direct current; a measuring circuit configured to measure an output current of the physical amount transformer, the measuring circuit including a detector connected to at least one of an anode side of a first rectifying element on a ground side of the first rectifier circuit and an anode side of a second rectifying element on the ground side of the second rectifier circuit; a power supply circuit configured to input outputs of the first and second rectifier circuits; a circuit switching unit configured to switch between a first state and a second state, the first state constituting a circuit inputting the output of the first and second rectifier circuits into the power supply circuit, the second state constituting a circuit directly inputting the output of the measuring circuit into the physical amount transformer; and a switching controller driven by the power supply circuit to control the circuit switching unit. The switching controller controls the circuit switching unit such that the circuit switching unit is in the first state during waiting, and the switching controller controls the circuit switching unit such that the circuit switching unit is in the second state during measurement.

According to one or more embodiments of the present invention, a measuring apparatus includes: a physical amount transformer configured to transform a physical amount into a current, the physical amount transformer including a connection portion used to take out an alternating current; a rectifier circuit configured to rectify an output current transformed by the physical amount transformer into a direct current; a measuring circuit connected in parallel to the rectifier circuit to measure the output current of the physical amount transformer; a power supply circuit configured to input the output of the rectifier circuit; a circuit switching unit configured to switch between a first state and a second state, the first state constituting a circuit inputting the output of the rectifier circuit into the power supply circuit, the second state constituting a circuit directly inputting the output of the measuring circuit into the physical amount transformer; and a switching controller driven by the power supply circuit to control the circuit switching unit. The switching controller controls the circuit switching unit such that the circuit switching unit is in the first state during waiting, and the switching controller controls the circuit switching unit such that the circuit switching unit is in the second state during measurement.

According to one or more embodiments of the present invention, a measuring method for measuring a current, the measuring method includes: a transformation step of transforming a physical amount into the current with a physical amount transformer; a step of supplying an output current transformed in the transformation step to the power supply circuit during waiting by controlling a circuit switching unit configured to switch between a first state and a second state into the first state, the first state constituting a circuit inputting an output of a measuring circuit into a power supply circuit, the second state constituting a circuit directly inputting the output of the measuring circuit into the physical amount transformer; and a step of measuring the output current transformed in the transformation step during the period other than waiting by controlling the circuit switching unit into the second state.

In one or more embodiments of the present invention, current may accurately be measured.

DETAILED DESCRIPTION

Figure 1:
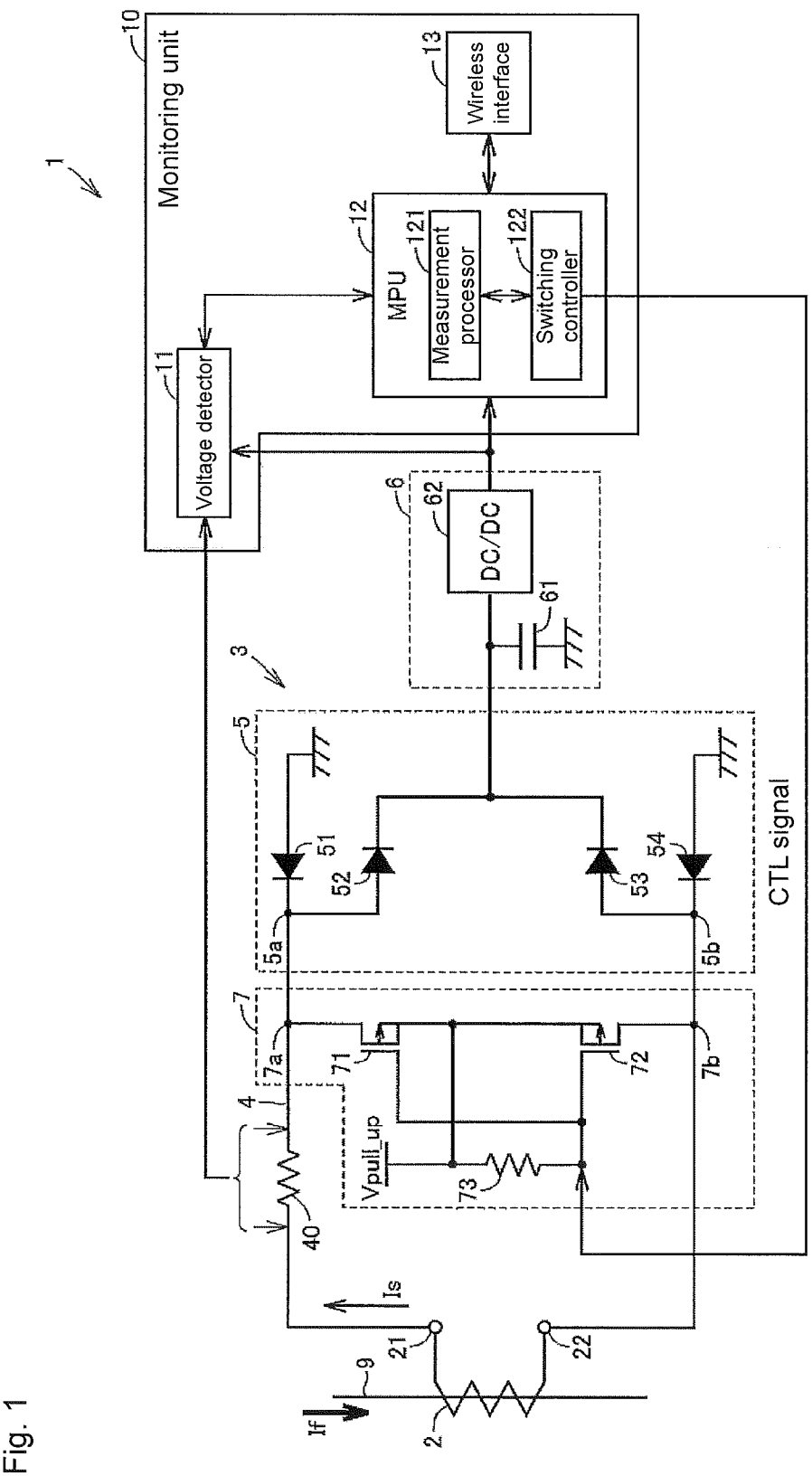
FIG. 1 is a configuration diagram illustrating a measuring apparatus according to a first embodiment of the present invention.

Hereinafter, embodiments of the present invention will be described in detail with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. In the drawings, the identical or equivalent component is designated by the identical symbol and the description thereof is not repeated.

First Embodiment

In a measuring apparatus according to a first embodiment, a physical amount is transformed into current, and the current is used as electric power. For example, the transformation into the current is performed by a CT (Current Transformer) that is of a current transformer. The CT takes out the current passed through a power line while transforming the current with a predetermined current transformation ratio. In this case, the physical amount is power.

A schematic configuration of the measuring apparatus of the first embodiment will be described.

(Schematic Configuration)

FIG. 1 is a configuration diagram illustrating a measuring apparatus 1 of the first embodiment. Referring to FIG. 1, the measuring apparatus 1 measures at least the current passed through a power line 9. The measuring apparatus 1 of the first embodiment measures the current passed through the power line 9, thereby measuring power consumption supplied through the power line 9 in an electric facility. The measuring apparatus 1 includes a CT 2 and a secondary circuit 3 of the CT 2. The secondary circuit 3 includes a measuring circuit 4, a rectifier circuit 5, a power supply circuit 6, and a switching circuit 7. The measuring apparatus 1 also includes a monitoring unit 10 connected to the secondary circuit 3 of the CT 2.

The CT 2 transforms primary current If passed through the power line 9 into secondary current, and takes out the secondary current from a pair of terminals (connection portions) 21 and 22. Thus, the CT 2 extracts the current of a measuring target. The measuring circuit 4 measures the output current Is from the CT 2. For example, the measuring circuit 4 includes a resistor 40 as a detector that detects the output current Is. Hereinafter, the resistor is referred to as a "detection resistor 40". The rectifier circuit 5 rectifies the output current Is of alternating current into direct current. In the first embodiment, the rectifier circuit 5 is provided at a subsequent stage of the detection resistor 40. Alternatively, the rectifier circuit 5 may be provided at a preceding stage of the detection resistor 40. In this case, the detection resistor 40 detects the current rectified by the rectifier circuit 5.

The rectified direct current is input to the power supply circuit 6, and used as the electric power. The power supply circuit 6 includes a charger 61 and a DC-DC converter 62. For example, a capacitor is used as the charger 61. Alternatively, a secondary battery may be used as the charger 61. The DC-DC converter 62 converts a DC voltage from the charger 61 into a predetermined level, and supplies the electric power to the monitoring unit 10. The power supply circuit 6 is not limited to the configuration in FIG. 1. For example, a converter may be interposed at the preceding stage of the charger 61.

In the first embodiment, the switching circuit 7 is provided in a connection portion between the detection resistor 40 and the rectifier circuit 5. The switching circuit 7 electrically connects and interrupts the measuring circuit 4 and the power supply circuit 6. That is, the switching circuit 7 switches between a first state that constitutes a circuit inputting output of the measuring circuit 4 to the power supply circuit 5 and a second state that constitutes a circuit directly inputting the output of the measuring circuit 4 to the CT 2. As used herein, in the first embodiment, the term "directly inputting" means that the output of the measuring circuit 4 is input without passing through the rectifier circuit 5 and the power supply circuit 6. Accordingly, in the second state, a closed loop of the current is formed between the measuring circuit 4 and the CT 2. The switching circuit 7 is described in detail later.

The monitoring unit 10 includes a voltage detector 11 that detects a voltage, an MPU (Micro-Processing Unit) 12 that is of a control device performing various pieces of arithmetic processing, and a wireless interface (interface) 13. Each unit of the monitoring unit 10 is driven by the power supply circuit 6.

The voltage detector 11 detects a potential difference between both ends of the detection resistor 40. It is assumed that the voltage detector 11 includes an operational amplifier (not illustrated) that amplifies a voltage signal and an ND (Analog-to-Digital) converter (not illustrated) that converts the input voltage signal into a digital signal. The voltage detector 11 outputs the detected voltage signal to the MPU 12.

The MPU 12 controls the measurement of the output current Is from the CT 2. In the first embodiment, the MPU 12 includes a measurement processor 121 that performs processing of measuring the current and a switching controller 122 that performs switching control of the switching circuit 7 as a functional configuration. The measurement processor 121 calculates the power consumption in the electric facility based on the voltage signal obtained from the voltage detector 11. The specific control of the switching controller 122 is described later.

The wireless interface 13 conducts wireless communication with an external device (computer, not illustrated). For example, the wireless interface 13 transmits measurement data from the measurement processor 121 to the external device.

A configuration of a general secondary circuit will be described in advance of the detailed description of the secondary circuit 3 of the first embodiment.

(Configuration of General Secondary Circuit)

Figure 17:
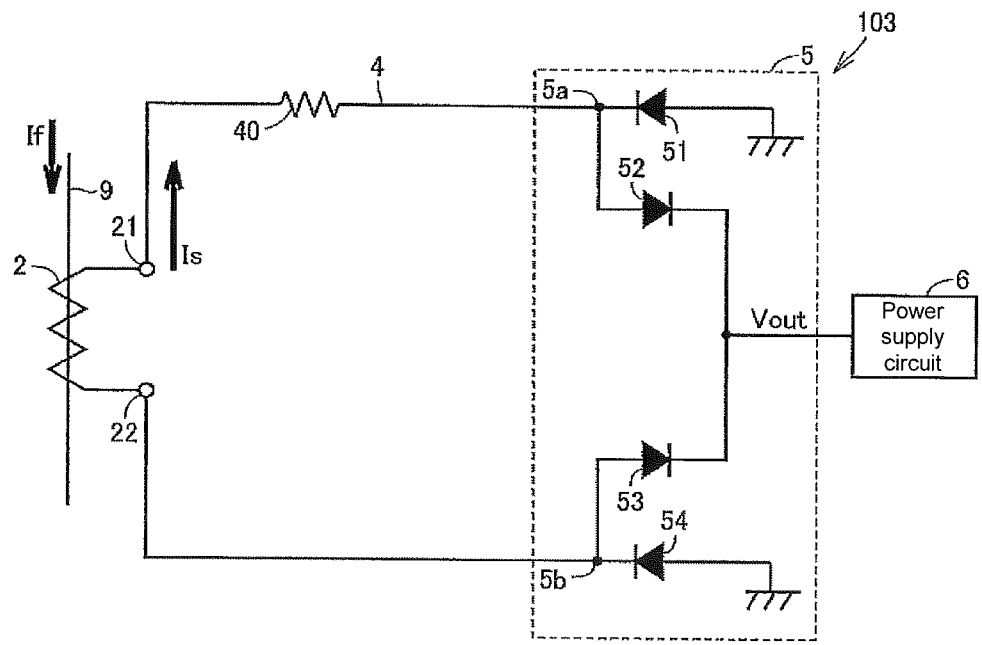
FIG. 17 is a view illustrating a configuration of a general secondary circuit.

FIG. 17 is a view illustrating a configuration of a general secondary circuit 103. Referring to FIG. 17, compared with the secondary circuit 3 in FIG. 1, a secondary circuit 103 does not include the switching circuit 7. In the secondary circuit 103, a terminal 21 of the CT 2 is connected to one end 5a of the rectifier circuit 5 through the detection resistor 40 (measuring circuit 4). A terminal 22 of the CT 2 is connected to the other end 5b of the rectifier circuit 5. The rectifier circuit 5 is constructed with four rectifying elements 51 to 54. Hereinafter, a circuit constructed with the rectifying elements 51 and 52 on the side of the end 5a is also referred to as a first rectifier circuit, and a circuit constructed with the rectifying elements 53 and 54 on the side of the end 5b is also referred to as a second rectifier circuit.

For the secondary circuit 103, a voltage load is applied to the terminal 21 of the CT 2 by an input-side voltage (hereinafter, referred to as a "power supply voltage") Vout of the power supply circuit 6. Therefore, the voltage load has an influence on a transfer characteristic (current output characteristic) of the CT 2, and the output current Is decreases compared with an ideal value. That is, even if the power supply voltage Vout does not reach a saturation voltage, the voltage load is applied onto the side of the terminal 21 to decrease the output current Is. The ideal value is equal to a value of the output current of the secondary circuit in FIG. 4 that does not include the rectifier circuit 5 and the power supply circuit 6.

On the other hand, in the case that the CT 2 has the excellent transfer characteristic, the influence of the voltage load hardly appears because the saturation voltage of the power supply voltage Vout increases. Accordingly, in the case that the current is measured with the secondary circuit 103 in FIG. 17, it is necessary to select the CT 2 having the excellent transfer characteristic.

Figure 18:
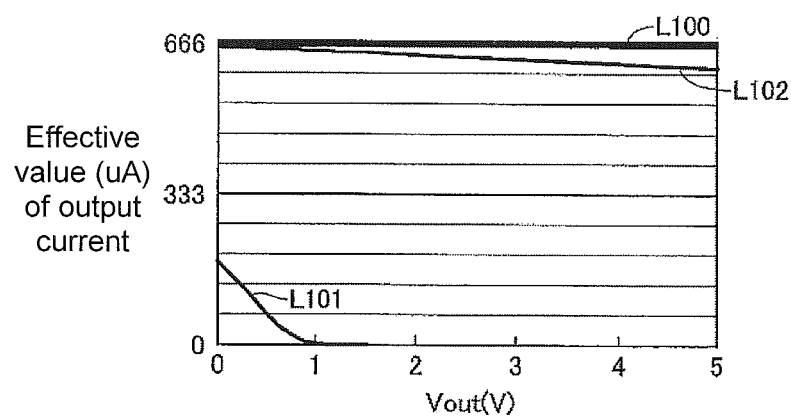
FIG. 18 is a graph illustrating an influence of the output current of a CT (Current Transformer) when the general secondary circuit is used.

FIG. 18 is a graph illustrating the influence of the output current of a CT 2 when the general secondary circuit 103 is used. In the graph of FIG. 18, a vertical axis indicates an effective value (in terms of uA) of the output current Is of the CT 2, and a horizontal axis indicates the power supply voltage Vout (in terms of V). In the graph, a line L100 indicates ideal output, a line L101 indicates output of the CT (hereinafter, referred to as a "first CT") having the poor transfer characteristic, and a line L102 indicates the CT (hereinafter, referred to as a "second CT") having the good transfer characteristic. In the first CT, a core is made of silicon steel, the core has a sectional area of 20 mm$^2$, the core has a peripheral length of 110 mm, and the number of secondary windings is 3000. In the second CT, the core is made of ferrite, the core has the sectional area of 54.24 mm$^2$, the core has the peripheral length of 119.8 mm, and the number of secondary windings is 3000. The second CT has low magnetic resistance of the core and a large size compared with the first CT. The second CT differs from the first CT in the material. Therefore, the second CT is more expensive than the first CT.

Figure 19:
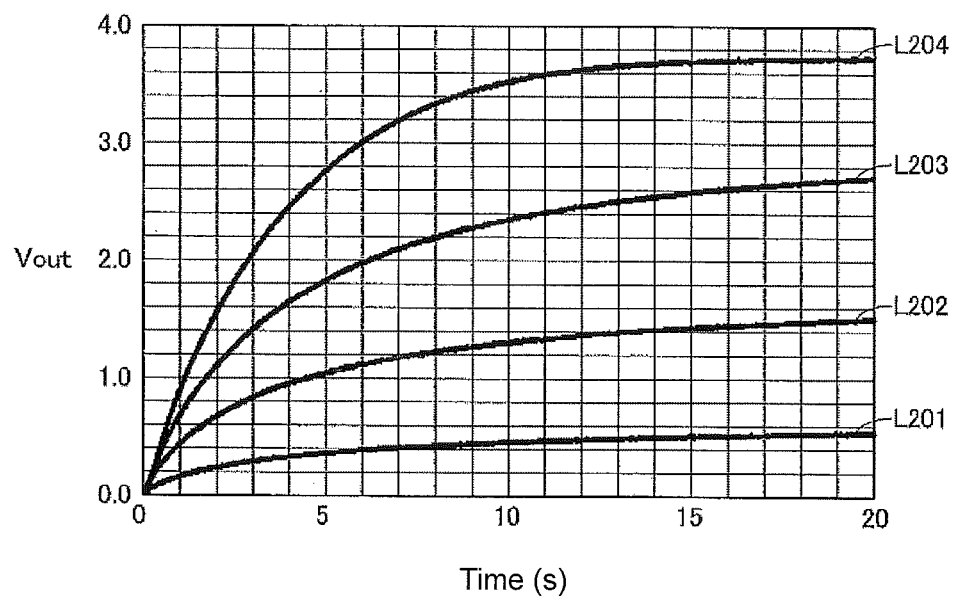
FIG. 19 is a graph illustrating a charging characteristic of a charger when the CT having a poor transform characteristic is used.

As indicated by the line L101 in FIG. 18, in the first CT, the output current Is is considerably lower than the ideal value even if the power supply voltage Vout is 0 V. FIG. 19 illustrates a charging characteristic of the charger 61 (FIG. 1) included in the power supply circuit 6 when the first CT is used. In the graph of FIG. 19, lines L201 to L204 indicate the charging characteristics of the charger 61 when the primary current If is 2 A, 3 A, 4 A, and 5 A, respectively. As can be seen from FIG. 19, the measurement accuracy can hardly be guaranteed in the case that the first CT is used in the general secondary circuit 103.

On the other hand, as indicated by the line L102 in FIG. 18, in the second CT, the output current Is is close to the ideal value during the low power supply voltage Vout. However, even in the second CT, a difference between the output current Is and the ideal value increases with increasing power supply voltage Vout. Accordingly, it is found that the current (power) can hardly be measure with high accuracy even if the second CT is used in the general secondary circuit 103.

Therefore, in the first embodiment, the measurement is performed at intervals, and the rectifier circuit 5 and the power supply circuit 6 are separated from the measuring circuit 4 during the measurement. The configuration of the secondary circuit 3 of the first embodiment will be described in detail below.

(Secondary Circuit of First Embodiment)

Referring to FIG. 1, in the secondary circuit 3 of the first embodiment, the switching circuit 7 is connected in parallel to the rectifier circuit 5 on the current output terminal side of the detection resistor 40 that is of the detector. Accordingly, the terminal 21 of the CT 2 is connected to one end 7a of the switching circuit 7 and one end 5a of the rectifier circuit 5 through the detection resistor 40. The terminal 22 of the CT 2 is connected to the other end 7b of the switching circuit 7 and the other end 5b of the rectifier circuit 5.

In the first embodiment, the switching circuit 7 includes p-type FETs (Field Effect Transistors) 71 and 72 having an identical polarity as a pair of switching elements. The FETs 71 and 72 having the identical polarity are disposed in directions opposite to each other in order to put alternating current into off state on both positive and negative directions. A drain of the FET 71 is connected to the end 7a of the switching circuit 7. A source of the FET 71 is connected to a source of the FET 72 while a predetermined voltage Vpull_up is supplied to the source of the FET 71. A drain of the FET 72 is connected to the end 7b of the switching circuit 7. The predetermined voltage Vpull_up is provided to a gate of the FET 72 through a resistor 73. A control signal (CTL signal) is provided to the gates of the FETs 71 and 72 from the switching controller 122 of the MPU 12. The switching circuit 7 may include at least three switching elements.

The measuring circuit 4 and the power supply circuit 6 are electrically connected to each other when the FETs 71 and 72 are put into a non-conduction state, and the measuring circuit 4 and the power supply circuit 6 are electrically interrupted from each other when the FETs 71 and 72 are put into a conduction state. The switching controller 122 of the MPU 12 controls the FETs 71 and 72.

A passage of the output current Is according to the control of the switching controller 122 will now be described below. In the first embodiment, the FETs 71 and 72 are put into the conduction state during the measurement, and the FETs 71 and 72 are put into the non-conduction state during at least waiting. As used herein, the term "during the measurement" means a period during which the measurement processor 121 performs measuring processing, namely, a period during which the voltage detector 11 detects the voltage at the detection resistor 40. The term "during the waiting" means a period during which at least the period of the measurement is excluded. In the first embodiment, it is assumed that a period of measurement data processing is also included in the waiting period. The measurement data processing includes processing of transmitting the measurement data and processing of recording the measurement data.

Figure 2:
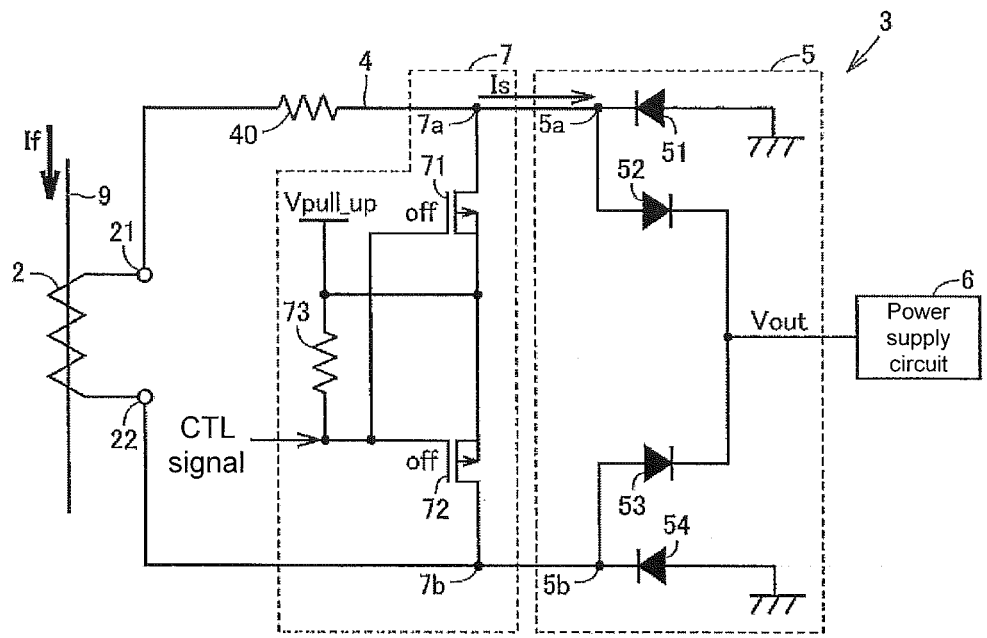
FIG. 2 is a view illustrating a passage of output current during supply of power in a secondary circuit according to the first embodiment of the present invention.
Figure 3:
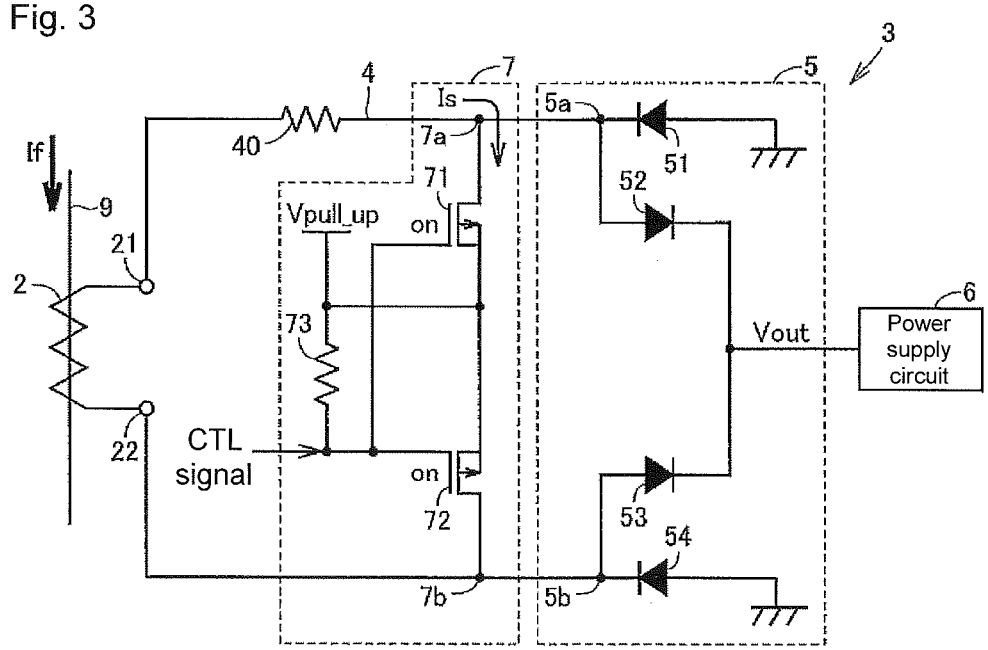
FIG. 3 is a view illustrating the passage of the output current during measurement in the secondary circuit according to the first embodiment of the present invention.

FIG. 2 is a view illustrating a passage of the output current Is during the supply of the power in the secondary circuit 3 according to the first embodiment of the present invention. FIG. 3 is a view illustrating a passage of the output current Is during the measurement in the secondary circuit 3 according to the first embodiment of the present invention.

Referring to FIGS. 1 and 2, the switching controller 122 puts the FETs 71 and 72 of the switching circuit 7 into the off (non-conduction) state during the waiting. In this case, because the ends 7a and 7b of the switching circuit 7 are insulated from each other, the output current Is is passed to the rectifier circuit 5 through the measuring circuit 4 (detection resistor 40). Accordingly, the charger 61 is charged with the direct current rectified by the rectifier circuit 5. In this case, the secondary circuit 3 has the circuit configuration equivalent to that of the general secondary circuit 103 in FIG. 17.

Figure 4:
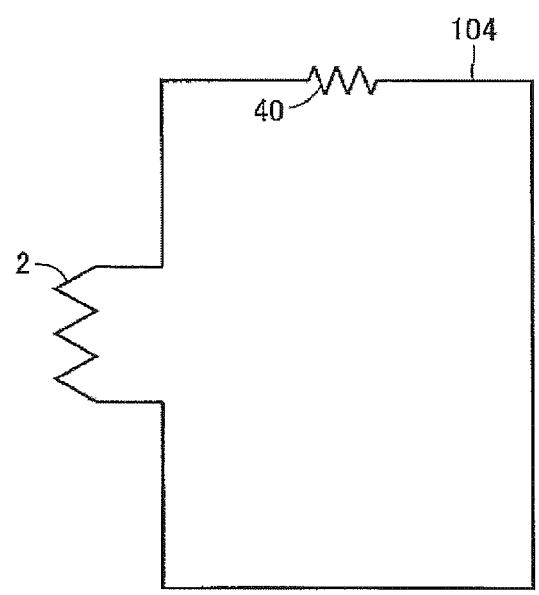
FIG. 4 is a view illustrating a simple circuit configuration when a power supply circuit is not included in the secondary circuit.

On the other hand, referring to FIGS. 1 and 3, the switching controller 122 outputs the control signal during the measurement in order to put the FETs 71 and 72 of the switching circuit 7 into the on (conduction) state. In this case, the ends 7a and 7b of the switching circuit 7 are electrically connected to each other. The predetermined voltage Vpull_up applied to the connection portion of the FETs 71 and 72 is decided between a ground potential (0 V) and the power supply voltage Vout. Because the voltage at a contact 7a in which the FETs 71 and 72 are connected to the current output terminal of the detection resistor 40 becomes a value between the ground potential (0 V) and the power supply voltage Vout, a reverse bias voltage is applied to all the rectifying elements (diodes) 51 to 54 of the rectifier circuit 5. Therefore, the output current Is is not passed onto the side of the rectifier circuit 5 through the detection resistor 40, but the output current Is is passed to the end 7b of the switching circuit 7. In this case, the secondary circuit 3 has the circuit configuration equivalent to that of a simple measuring circuit 104 that does not include the power supply circuit 6 as illustrated in FIG. 4. When the current measurement is ended, the switching controller 122 outputs the control signal in order to put the FETs 71 and 72 of the switching circuit 7 into the off state again.

(Operation)

The operation of the measuring apparatus 1 will be described together with the switching control of the switching controller 122.

Figure 5:
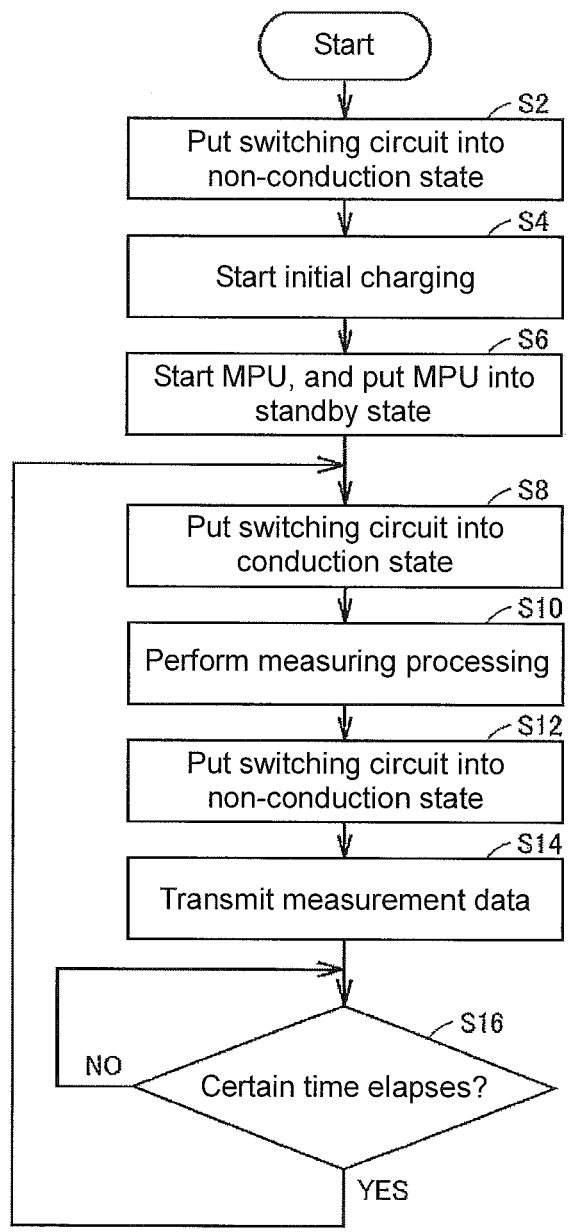
FIG. 5 is a flowchart illustrating measuring processing performed by the measuring apparatus according to the first embodiment of the present invention.

FIG. 5 is a flowchart illustrating measuring processing performed by the measuring apparatus 1 according to the first embodiment of the present invention. The measuring processing in FIG. 5 is performed when the MPU 12 executes a program stored in a storage (not illustrated).

Referring to FIGS. 1 and 5, at first the switching controller 122 puts the switching circuit 7 into the non-conduction state (Step S2). When the CT 2 is connected to the power line 9 to take out the output current Is, initial charging is started with respect to the charger 61 of the power supply circuit 6 (Step S4). The MPU 12 is then started and put into the standby state (Step S6). As used herein, the standby state means a standby state of the MPU 12, but is not matched with the waiting state (during the waiting) of the switching control.

When the MPU 12 becomes the standby state, the switching controller 122 puts the switching circuit 7 into the conduction state for the purpose of the measuring processing (Step S8). That is, the switching controller 122 transmits an on signal to the gates of the FETs 71 and 72. Therefore, as illustrated in FIG. 3, the output current Is is passed not onto the side of the power supply circuit 6 (charger 61) but into the measuring circuit 4. When the switching circuit 7 is put into the conduction state, the measurement processor 121 of the MPU 12 starts the measuring processing (Step S10). For example, the measurement processor 121 performs the measuring processing for a certain time.

When the measuring processing is ended, the switching controller 122 puts the switching circuit 7 into the non-conduction state again (Step S12). That is, the switching controller 122 transmits an off signal to the gates of the FETs 71 and 72. Therefore, as illustrated in FIG. 2, the output current Is is passed onto the side of the power supply circuit 6.

The measurement processor 121 transmits the measurement data to the external device based on the measuring processing performed in Step S10 (Step S14). Specifically, the measurement data is transmitted to the external device via the wireless interface 13. When the transmission processing is ended, the MPU 12 is put into the standby state again.

For example, when a certain time elapses since the standby state (Yes in Step S16), the flow returns to Step S8 to repeat the above pieces of processing. In the first embodiment, the measurement data is transmitted (Step S14) in each piece of measuring processing (Step S10). Alternatively, the measurement data may be transmitted in each predetermined number of times. In such cases, the measurement data is recorded in the storage (not illustrated) of the own device or a removable recording medium (not illustrated), and the recorded measurement data may be read when the measurement data is transmitted.

As described above, in the first embodiment, the switching circuit 7 is put into the conduction state only during the measurement, and therefore the secondary circuit 3 is put into the "second state". On the other hand, the switching circuit 7 is put into the non-conduction state during the waiting (in the first embodiment, during the non-measurement), and therefore the secondary circuit 3 is put into the "first state".

Figure 6:
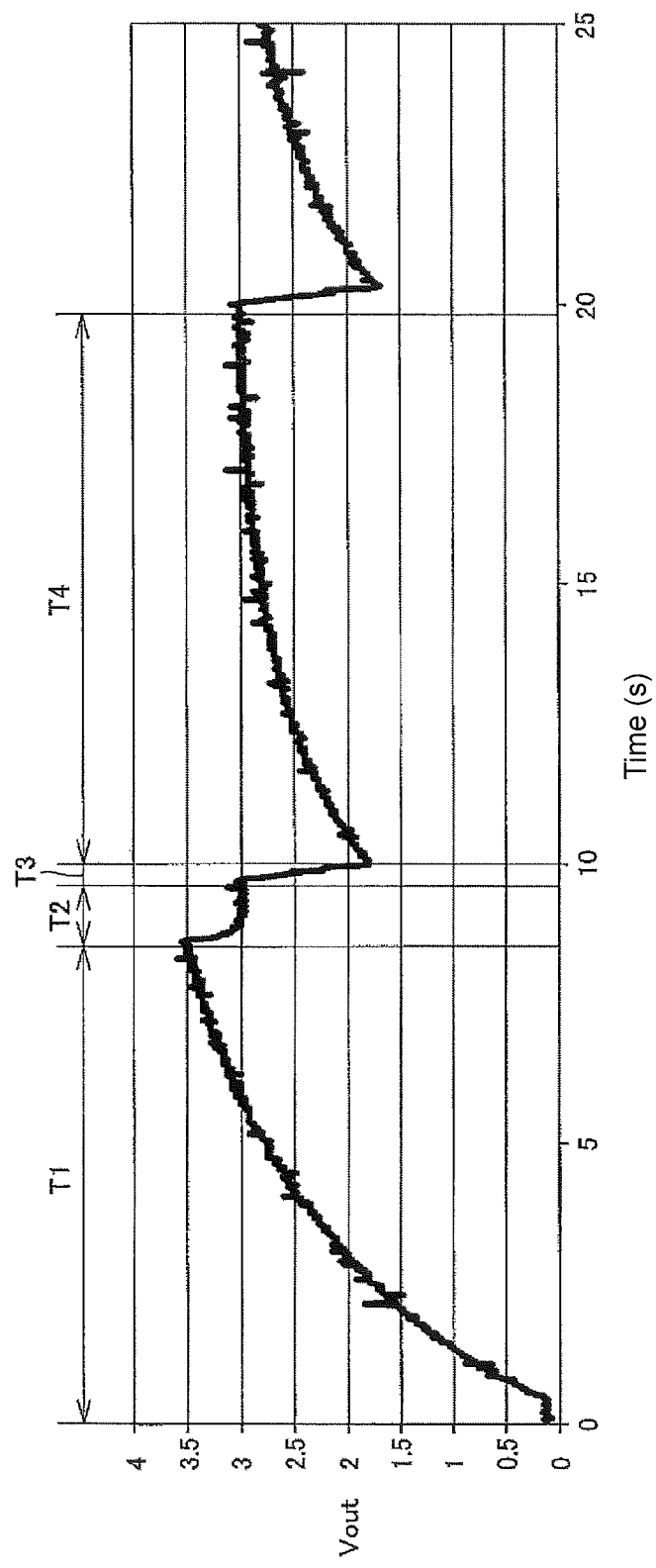
FIG. 6 is a view illustrating a first operation result of the measuring apparatus according to the first embodiment of the present invention.
Figure 7:
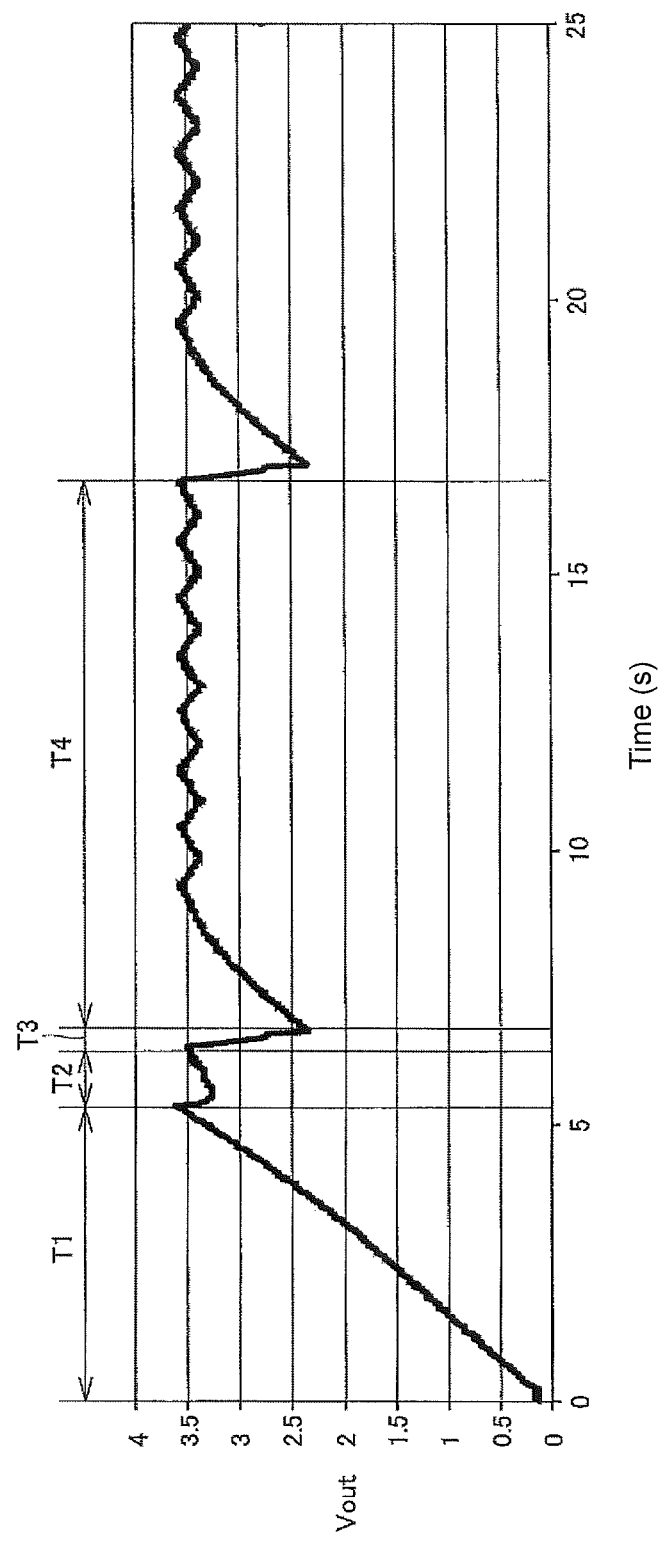
FIG. 7 is a view illustrating a second operation result of the measuring apparatus according to the first embodiment of the present invention.

FIG. 6 is a view illustrating a first operation result of the measuring apparatus 1 according to the first embodiment of the present invention. FIG. 7 is a view illustrating a second operation result of the measuring apparatus 1 according to the first embodiment of the present invention. In the first operation result, a change in power supply voltage Vout during each operation is expressed along a time axis when the CT 2 is constructed with the first CT. In the second operation result, the change in power supply voltage Vout during each operation is expressed along the time axis when the CT 2 is constructed with the second CT.

A voltage change in the initial charging (Step S4 in FIG. 5) is indicated during a period T1 in FIGS. 6 and 7. The voltage change in starting the MPU 12 (Step S6 in FIG. 5) is indicated during a period T2. The voltage change in performing the measuring processing and the transmission processing (Steps S10 and S14 in FIG. 5) is indicated during a period T3. The voltage change in the standby state of the MPU 12 (Step S16 in FIG. 5) is indicated during a period T4.

As illustrated in FIGS. 6 and 7, the power supply voltage Vout drops steeply by the measuring processing and the transmission processing. However, even if either the first CT or the second CT is used as the CT 2, the subsequent measuring processing and transmission processing can properly be performed by performing the charging for a certain period (T4). Thus, in the first embodiment, the switching circuit 7 is constructed with the low-power-consumption FETs 71 and 72, so that the necessary processing (such as the measuring processing and the transmission processing) can be performed without influencing the supply of the power to the power supply circuit 6 even if the switching control is performed.

(Validation Result)

A validation result for reliability of the measurement data obtained by the operation will be described below.

Figure 8:
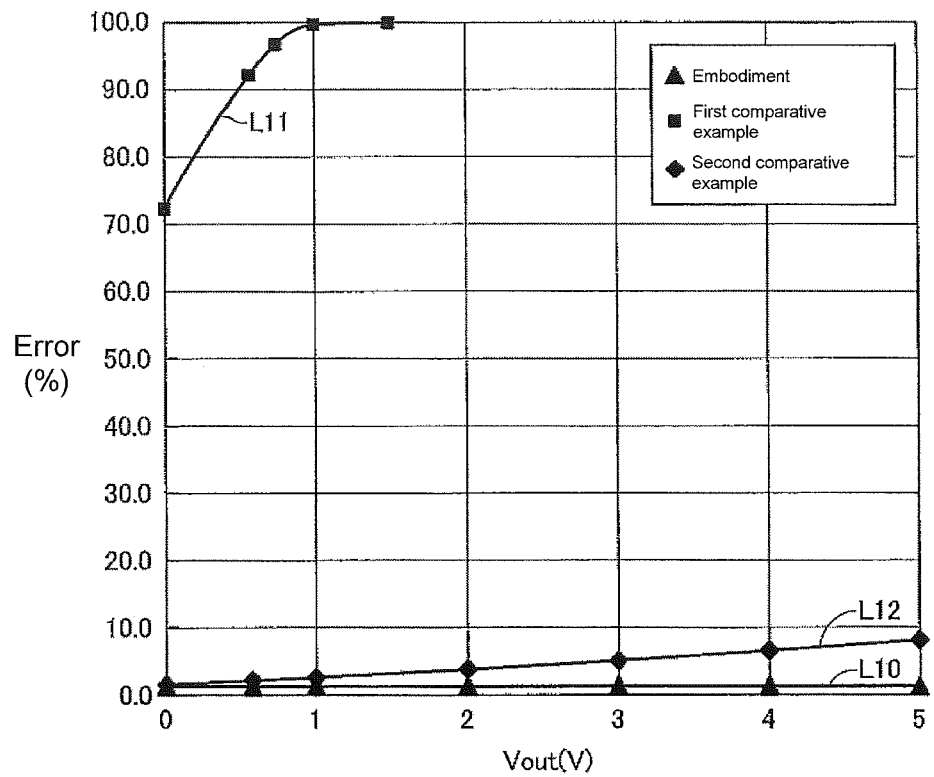
FIG. 8 is a graph illustrating a measurement error of each of measuring apparatuses according to the first embodiment of the present invention and first and second comparative examples.

FIG. 8 is a graph illustrating a measurement error of each of measuring apparatuses according to the first embodiment of the present invention and first and second comparative examples. In the measuring apparatus of the first comparative example, the secondary circuit is constructed with the circuit 103 in FIG. 17, and the CT 2 is constructed with the first CT. In the measuring apparatus of the second comparative example, the secondary circuit is constructed with the circuit 103 in FIG. 17, and the CT 2 is constructed with the second CT. In the first embodiment, the CT 2 is constructed with the first CT.

In the graph of FIG. 8, a horizontal axis indicates the power supply voltage Vout (V), and a vertical axis indicates the measurement error (%). The measurement error indicates an error with a measured value (ideal value) in the measuring circuit 104 of FIG. 4. The measuring circuit 104 has the configuration in which the rectifier circuit 5 and the power supply circuit 6 are not included in the subsequent stage of the measuring circuit 4. In FIG. 8, a line L11 indicates the measurement error in the first comparative example, and a line L12 indicates the measurement error in the second comparative example. A line L10 indicates the measurement error in the first embodiment.

As described above, the output current Is is influenced for the secondary circuit 103 that does not include the switching circuit 7. As indicated by the line L11, for the first CT having the poor transfer characteristic, the error exceeds 70% even at a time point the power supply voltage Vout is 0 V. As indicated by the line L12, even for the second CT having the good transfer characteristic, the error increases with increasing power supply voltage Vout, and the error becomes about 10% near the saturation voltage.

On the other hand, as indicated by the line L10, in the measuring apparatus 1 of the first embodiment, the measurement error is about 0% irrespective of the power supply voltage even if the CT 2 is constructed with the first CT having the poor transfer characteristic. Thus, in the first embodiment, the current can accurately be measured irrespective of the transfer characteristic of the CT 2. As a result, downsizing and cost reduction of the apparatus can be achieved.

Second Embodiment

In the first embodiment, the switching circuit 7 is constructed with the pair of p-type FETs. Alternatively, the switching circuit 7 can also be constructed with an n-type FET. Only a different point with the first embodiment will be described below.

Figure 9:
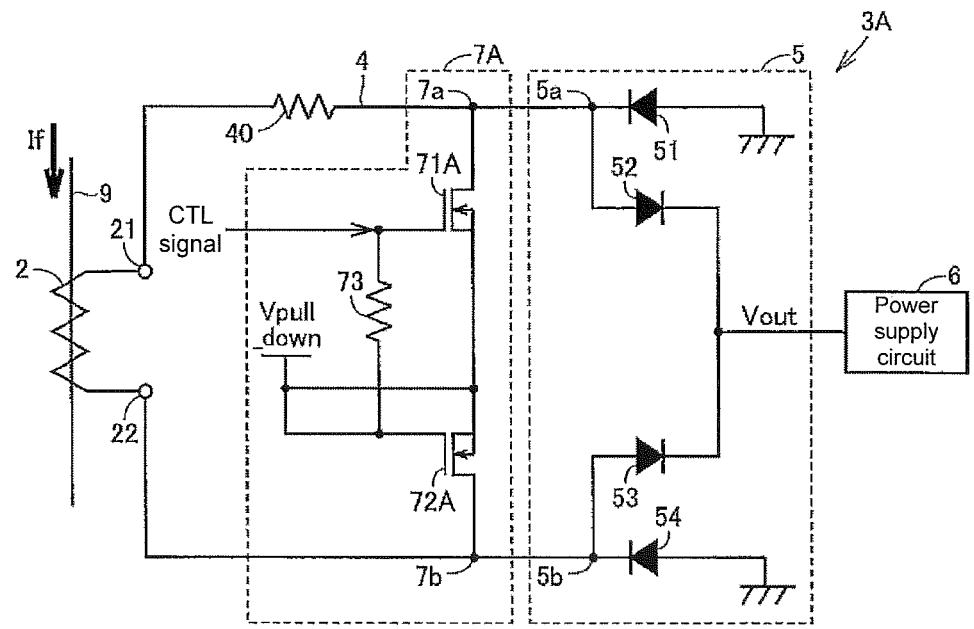
FIG. 9 is a view illustrating a configuration of a secondary circuit according to a second embodiment of the present invention.

FIG. 9 is a view illustrating a configuration of a secondary circuit 3A according to a second embodiment of the present invention. In FIG. 9, the same configuration as the secondary circuit 3 in FIG. 1 is designated by the same numeral. Accordingly, the overlapping description is not repeated. The same holds true for one or more of the subsequent embodiments.

Referring to FIG. 9, in the second embodiment, the secondary circuit 3A includes a switching circuit 7A instead of the switching circuit 7 of the first embodiment. The position to which the switching circuit 7A is connected is identical to that of the first embodiment.

The switching circuit 7A includes a pair of n-type FETs 71A and 72A having the identical polarity. The drain of the FET 71A is connected to the end 7*a* of the switching circuit 7. The source of the FET 71A is connected to the source of the FET 72A while a predetermined voltage Vpull_down is supplied to the source of the FET 71A. The drain of the FET 72A is connected to the end 7*b* of the switching circuit 7. The predetermined voltage Vpull_down is provided to the gate of the FET 72A. The control signal is provided to the gates of the FETs 71A and 72A from the switching controller 122 of the MPU 12. The control signal is provided to the gate of the FET 72A through the resistor 73.

In the second embodiment, the predetermined voltage Vpull_down applied to the connection portion of the FETs 71A and 72A is also decided between the ground potential (0 V) and the power supply voltage Vout.

In the first and second embodiments, the p-type or n-type FET is used as the switching element. Alternatively, not only the FET but also a bipolar transistor may be used as the switching element.

Third Embodiment

A configuration in which the detection resistor is located between the ground potential and the rectifying element in the secondary circuit will be described in a third embodiment. However, in this case, the switching circuit is provided in the connection portion between the measuring circuit (detection resistor) and the rectifier circuit. Only a different point with the first embodiment will be described below.

Figure 10:
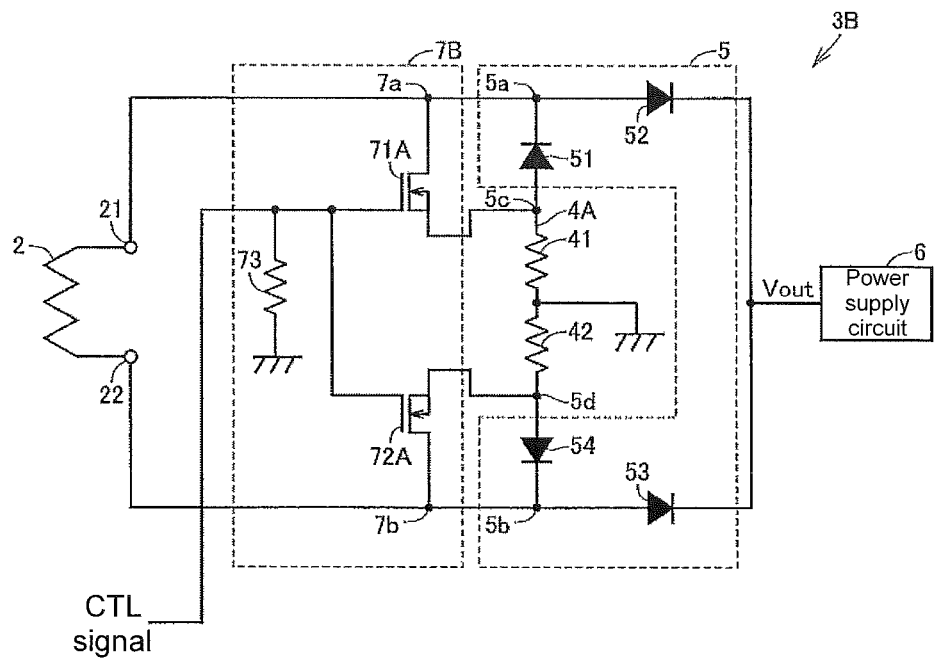
FIG. 10 is a view illustrating a configuration of a secondary circuit according to a third embodiment of the present invention.

FIG. 10 is a view illustrating a configuration of a secondary circuit 3B according to the third embodiment of the present invention. Referring to FIG. 10, in the third embodiment, the secondary circuit 3B includes a measuring circuit 4A and a switching circuit 7B instead of the measuring circuit 4 and the switching circuit 7 of the first embodiment.

The measuring circuit 4A includes a detection resistor 41 connected to an anode side 5c of the rectifying element 51 and a detection resistor 42 connected to an anode side 5d of the rectifying element 54. The rectifying element 51 is a diode on the ground side of the first rectifier circuit. The rectifying element 54 is a diode on the ground side of the second rectifier circuit. That is, one end is grounded in both the detection resistors 41 and 42.

In the third embodiment, the voltage detector 11 (FIG. 1) detects the voltage at each of the detection resistors 41 and 42. The measurement processor 121 (FIG. 1) of the MPU 12 measures the power based on each voltage. The detection resistors 41 and 42 are selected such that the voltage during the measurement does not exceed the power supply voltage Vout.

The switching circuit 7B includes the n-type FETs 71A and 72A. The FET 71A is connected between the terminal 21 of the CT 2 and the anode side 5c of the rectifying element 51, namely, between the terminal 21 of the CT 2 and the other end of the detection resistor 41. The FET 72A is connected between the terminal 22 of the CT 2 and the anode side 5d of the rectifying element 54, namely, between the terminal 22 of the CT 2 and the other end of the detection resistor 42. The control signal is provided to the gates of the FETs 71A and 72A. In the third embodiment, the resistor 73 is connected between the gates of the FETs 71A and 72A and the ground.

In the third embodiment, the switching controller 122 (FIG. 1) puts the FETs 71A and 72A into the non-conduction state during the non-measurement, and puts the FETs 71A and 72A into the conduction state during the measurement. Therefore, during the non-measurement, the secondary circuit 3B is put into the state constituting a circuit that inputs the outputs of the first and second rectifier circuits to the power supply circuit 6. During the measurement, the secondary circuit 3B is put into the state constituting a circuit that directly inputs the output of the measuring circuit 4A to the CT 2.

In the third embodiment, the measuring circuit 4A does not exist between the terminal 21 of the CT 2 and the input terminal 5a of the rectifier circuit 5. Therefore, in the case that the FETs 71A and 72A are put into the non-conduction state during the non-measurement, the measuring circuit 4A can be protected because the high voltage is not applied to the detection resistors 41 and 42.

Modification

Figure 11:
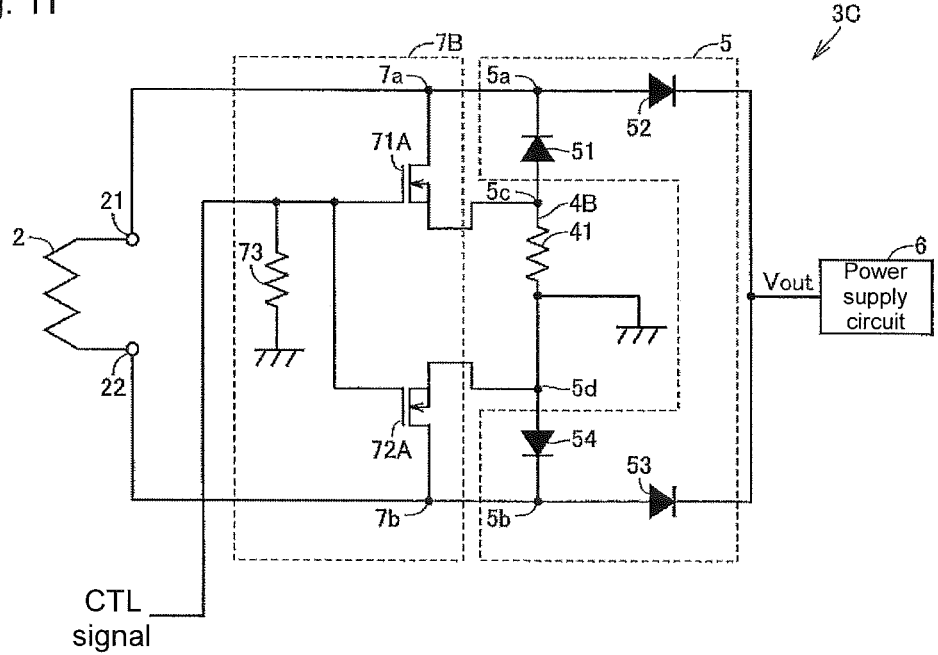
FIG. 11 is a view illustrating a configuration of a secondary circuit according to a modification of the third embodiment of the present invention.

In the third embodiment, the measuring circuit 4A includes the detection resistors 41 and 42 in each of which one end is grounded. Alternatively, the measuring circuit 4A may include only one of the detection resistors 41 and 42 in each of which one end is grounded. FIG. 11 illustrates a secondary circuit 3C in the case that the measuring circuit 4A may include only one of the detection resistors 41 and 42 in each of which one end is grounded.

Referring to FIG. 11, in the modification, for example, a measuring circuit 4B includes only the detection resistor 41. In this case, similarly to the first embodiment, the voltage detector 11 (FIG. 1) may detect only the voltage at the detection resistor 41.

In FIGS. 10 and 11, by way of example, the switching circuit 7B is constructed with the n-type FETs 71A and 72A. Alternatively, the switching circuit 7B may be constructed with other switching elements such as the p-type FET.

Fourth Embodiment

In the first to third embodiments, the switching circuit is constructed with the switching element. The switching circuit is not limited to the switching element, but the switching circuit may be constructed with an analog switch or a solid-state relay. The configuration of the secondary circuit in which the switching circuit is constructed with the analog switch will be described in a fourth embodiment.

Figure 12:
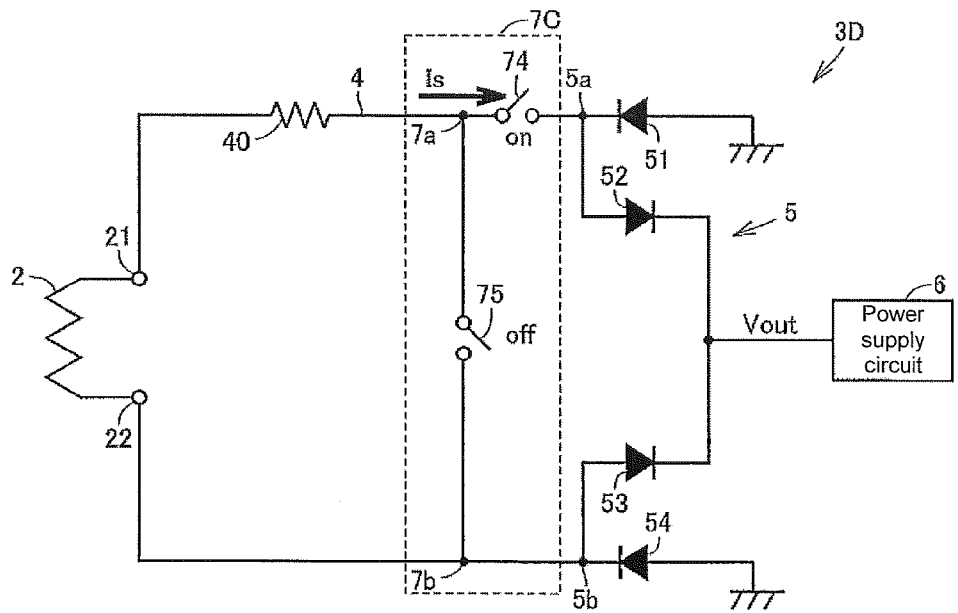
FIG. 12 is a view illustrating a configuration of a secondary circuit according to a fourth embodiment of the present invention and the passage of the output current during the supply of the power.
Figure 13:
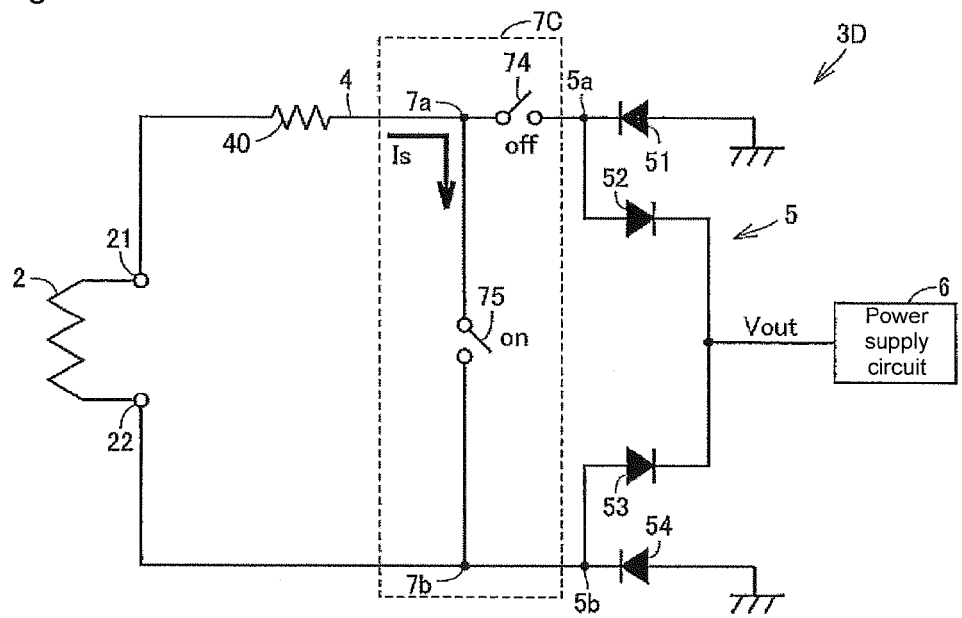
FIG. 13 is a view illustrating a configuration of the secondary circuit according to the fourth embodiment of the present invention and the passage of the output current during the measurement.

FIGS. 12 and 13 illustrate a configuration of a secondary circuit 3D according to the fourth embodiment of the present invention. FIGS. 12 and 13 illustrate the passages of the output current Is during the non-measurement and the measurement, respectively.

Referring to FIGS. 12 and 13, in the fourth embodiment, the secondary circuit 3D includes a switching circuit 7C instead of the switching circuit 7 of the first embodiment. The switching circuit 7C includes switches 74 and 75. The switch 75 is connected in parallel to the rectifier circuit 5 on the current output terminal side of the detection resistor 40. The switch 74 is connected in series to the detection resistor 40 on the subsequent stage side of the terminal 7a on the side of the detection resistor 40 of the switch 75. More specifically, in the switches 74 and 75, one end is connected onto the current output terminal side (terminal 7a) of the detection resistor 40. The other end of the switch 74 is connected to the end 5a of the rectifier circuit 5. The other end of the switch 75 is connected to the position (terminal 7b) between the terminal 22 of the CT 2 and the end 5b of the rectifier circuit 5.

As illustrated in FIG. 12, during the non-measurement, the switching controller 122 (FIG. 1) puts the switch 75 into the off state, and puts the switch 74 into the on state. The terminals 7a and 7b are insulated from each other, and the terminal 7a and the end 5a of the rectifier circuit 5 are electrically connected to each other. Accordingly, the output current Is is passed only on the side of the rectifier circuit 5, and the power is supplied to the power supply circuit 6.

On the other hand, as illustrated in FIG. 13, during the measurement, the switch 75 is put into the on state while the switch 74 is put into the off state. The terminals 7a and 7b are electrically connected to each other, and the terminal 7a and the end 5a of the rectifier circuit 5 are insulated from each other. Accordingly, the output current Is is passed through not the rectifier circuit 5, but only the measuring circuit 4.

In the case that the switching circuit is constructed with the pair of analog switches like the fourth embodiment, the power supply is required to operate the switches. For example, desirably the measuring apparatus of the fourth embodiment is provided with a primary battery (not illustrated) in order to operate the switches.

First Modification

In the fourth embodiment, the output current Is is passed through the detection resistor during the supply of the power (during the non-measurement). Alternatively, the output current Is needs not to be passed through the detection resistor during the supply of the power.

Figure 14:
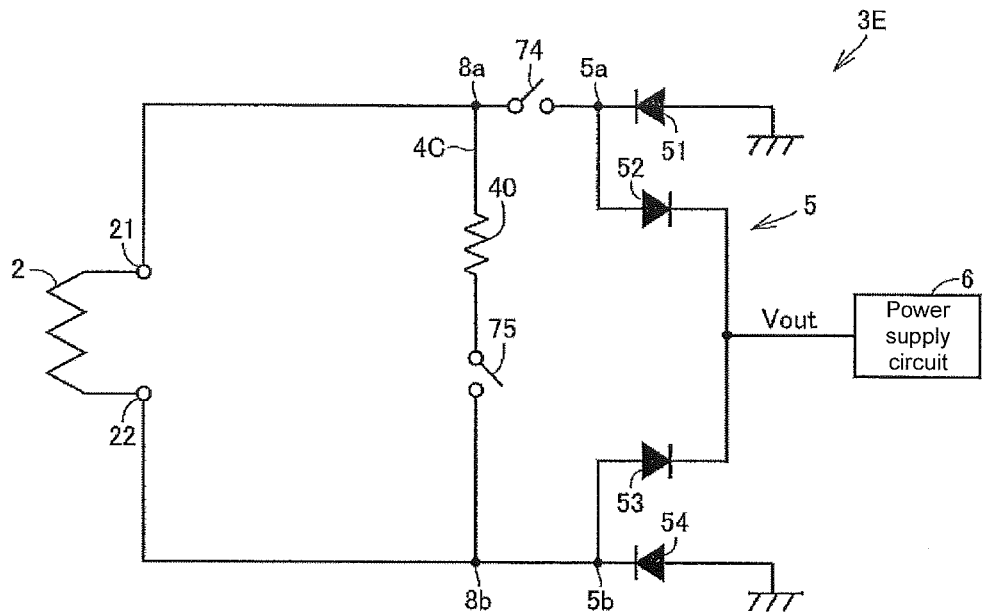
FIG. 14 is a view illustrating a configuration of a secondary circuit according to a first modification of the fourth embodiment of the present invention.

FIG. 14 is a view illustrating a configuration of a secondary circuit 3E according to a first modification of the fourth embodiment of the present invention. Referring to FIG. 14, in the first modification, the detection resistor 40 is connected in parallel to the rectifier circuit 5. Both ends of the parallel circuit constitute terminals 8a and 8b, respectively. In this case, the switch 74 is connected between the terminal 8a and the end 5a of the rectifier circuit 5. In the parallel circuit, the switch 75 is connected in series to the current output terminal side of the detection resistor 40.

The switching control of the switching controller 122 (FIG. 1) is identical to that of fourth embodiment. As a result, during the non-measurement, the secondary circuit 3E is put into the state constituting a circuit that inputs the outputs of the rectifier circuit 5 to the power supply circuit 6. During the measurement, the secondary circuit 3E is put into the state constituting a circuit that directly inputs the output of a measuring circuit 4C to the CT 2.

Second Modification

Figure 15:
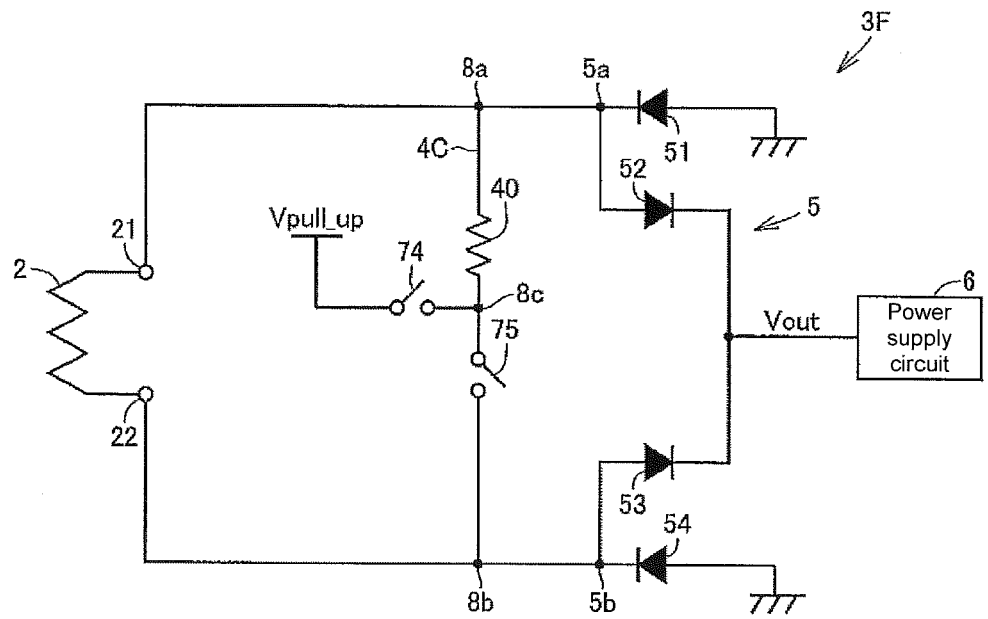
FIG. 15 is a view illustrating a configuration of a secondary circuit according to a second modification of the fourth embodiment of the present invention.

A configuration in FIG. 15 may be used in the case that the detection resistor 40 is connected in parallel to the rectifier circuit 5 like the first modification.

FIG. 15 is a view illustrating a configuration of a secondary circuit 3F according to a second modification of the fourth embodiment of the present invention. Referring to FIG. 15, in the second modification, the position of the switch 74 differs from that in FIG. 14. In the second modification, the predetermined voltage Vpull_up is supplied to a connection point 8c between the detection resistor 40 and the switch 75, and the switch 74 is connected onto the supply passage of the predetermined voltage Vpull_up.

In this case, the switching controller 122 (FIG. 1) puts the switches 74 and 75 into the off state during the non-measurement, and puts the switches 74 and 75 into the on state during the measurement. Even in this case, the voltage Vpull_up is decided between the ground potential (0 V) and the output voltage Vout to the power supply circuit 6. The reverse bias voltage is applied to all the rectifying diodes 51 to 54 of the rectifier circuit 5. Therefore, during the measurement, output current Is is passed only onto the side of the detection resistor 40 through the terminal 8a.

Third Modification

Figure 16:
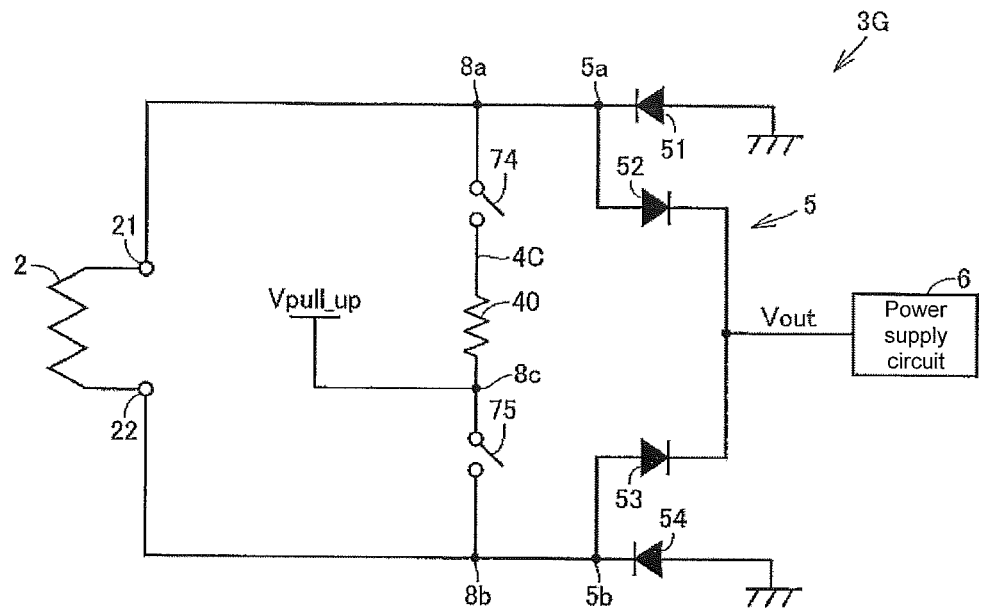
FIG. 16 is a view illustrating a configuration of a secondary circuit according to a third modification of the fourth embodiment of the present invention.

Alternatively, a configuration in FIG. 16 may be used in the case that the detection resistor 40 is connected in parallel to the rectifier circuit 5.

FIG. 16 is a view illustrating a configuration of a secondary circuit 3G according to a third modification of the fourth embodiment of the present invention. Referring to FIG. 16, the third modification differs from the configuration of FIG. 15 in the position of the switch 74. In the third modification, the predetermined voltage Vpull_up is also applied to the connection point 8c between the detection resistor 40 and the switch 75. In the parallel circuit, the switch 74 is connected in series to the current input terminal side of the detection resistor 40. In this case, the switching control of the switches 74 and 75 is similar to that of the second modification.

As described above, in one or more of the embodiments and modifications, the power supply circuit is electrically separated from the measuring circuit (detection resistor) during the measurement, so that the measurement accuracy can be improved. Accordingly, the measurement of the current and the supply of the power can properly be performed only by mounting one compact CT having the high magnetic resistance as the element transforming the physical amount into the current. As a result, the downsizing and cost reduction of the measuring apparatus can be achieved.

In one or more of the embodiments and modifications, the CT transforms the power into the current by way of example. Alternatively, another physical amount may be transformed into the current by energy harvesting. Examples of the measuring target physical amounts include i) wind-force amount, ii) hydraulic power amount, iii) heat amount, and iv) illuminance. In such cases, the measurement processor 121 in FIG. 1 detects the current or voltage using the measuring circuit to measure (calculates) each physical amount. In the case that the physical amount is i) wind-force amount and ii) hydraulic power amount, a motor is used as a transformation element. In the case that the physical amount is iii) heat amount, a Peltier element is used as the transformation element. In the case that the physical amount is iv) illuminance, a photoelectric element is used as the transformation element.

Even for the above transformation elements, sometimes the measurement accuracy is influenced when the power supply voltage at the subsequent stage increases relative to a power generation amount. More specifically, in the case that the motor is used as the transformation element, sometimes a torque unnecessary for the rotation of the motor is applied by the power supply voltage to decrease the output. In the case that the Peltier element and the photoelectric element are used as the transformation element, similarly to the CT, sometimes the current is not output according to the voltage generated between the elements due to the power supply voltage. Therefore, the kind of the usable element is restricted, and sometimes a freedom degree of product design is largely restricted. On the other hand, the restriction of the usable element is eliminated by using the secondary circuits of one or more of the embodiments and modifications. Accordingly, in one or more of the embodiments and modifications, the downsizing and cost reduction of the measuring apparatus can be achieved.

It is noted that the disclosed embodiments are not restrictive but illustrative in every way. The scope of the present invention is indicated not by the above description but by the claims, and the meanings equivalent to the claims and all the changes within the claims are included in the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

1 measuring apparatus
2 CT (Current Transformer)
3,3A,3B,3C,3D,3E,3F,3G secondary circuit
4,4A,4B,104 measuring circuit
5 rectifier circuit
6 power supply circuit
7,7A,7B,7C switching circuit
9 power line
10 monitoring unit
11 voltage detector
12 MPU
13 wireless interface
40,41,42 detection resistor
51,52,53,54 rectifying element
61 charger
62 DC-DC converter
71,71A,72,72A FET
73 resistor
121 measurement processor
122 switching controller

The invention claimed is:

1. A measuring apparatus comprising:
   a physical amount transformer that transforms a physical amount into a current;
   a measuring circuit that measures an output current of the physical amount transformer;
   a power supply circuit that receives as an input an output of the measuring circuit;
   a circuit switching unit, provided on a current output terminal side of the measuring circuit, that switches between a first state and a second state, the first state constituting a circuit inputting the output of the measuring circuit into the power supply circuit, the second state constituting a circuit directly inputting the output of the measuring circuit into the physical amount transformer; and
   a switching controller driven by the power supply circuit to control the circuit switching unit,
   wherein the switching controller controls the circuit switching unit such that the circuit switching unit is in the first state during waiting, and the switching controller controls the circuit switching unit such that the circuit switching unit is in the second state during measurement.

2. The measuring apparatus according to claim 1, further comprising:
   a rectifier circuit that rectifies the output current transformed by the physical amount transformer into a direct current,
   wherein the output current of the physical amount transformer is an alternating current.

3. The measuring apparatus according to claim 2,
   wherein the physical amount transformer comprises a connection portion used to take out an alternating current,
   wherein the measuring circuit comprises a detector that detects the current,
   wherein a current input terminal of the detector is connected to one end of the connection portion,
   wherein the rectifier circuit is connected onto a current output terminal side of the detector, and
   wherein the circuit switching unit is connected between the current output terminal side of the detector and the rectifier circuit.

4. The measuring apparatus according to claim 3,
   wherein the circuit switching unit comprises first and second switching elements having an identical polarity, and
   wherein each of the first and second switching elements being connected to a current output terminal of the detector and the other end of the connection portion.

5. The measuring apparatus according to claim 4, wherein a voltage at a contact where the first and second switching elements are connected to the current output terminal of the detector becomes a value between a ground potential and a voltage on an input side of the power supply circuit when the circuit switching unit is in the second state.

6. The measuring apparatus according to claim 4,
   wherein the switching controller puts the circuit switching unit into the first state during the waiting by putting the first and second switching elements into a non-conduction state, and
   wherein the switching controller puts the circuit switching unit into the second state during the measurement by putting the first and second switching elements into a conduction state.

7. The measuring apparatus according to claim 4, wherein the first and second switching elements comprise an n-type or p-type FET or a bipolar transistor.

8. The measuring apparatus according to claim 1, wherein the physical amount transformer is constructed with a current transformer configured to take out a current passed through a power line while transforming the current with a predetermined current transformation ratio.

9. A measuring apparatus comprising:
   a physical amount transformer that transforms a physical amount into a current, the physical amount transformer comprising a connection portion used to take out an alternating current;
   first and second rectifier circuits that rectify the alternating current passed through the connection portion into a direct current;
   a measuring circuit that measures an output current of the physical amount transformer, the measuring circuit comprising a detector connected to at least one of an anode side of a first rectifying element on a ground side of the first rectifier circuit and an anode side of a second rectifying element on the ground side of the second rectifier circuit;
   a power supply circuit that receives as inputs outputs of the first and second rectifier circuits;
   a circuit switching unit that switches between a first state and a second state, the first state constituting a circuit inputting the output of the first and second rectifier circuits into the power supply circuit, the second state constituting a circuit directly inputting the output of the measuring circuit into the physical amount transformer; and
   a switching controller driven by the power supply circuit to control the circuit switching unit,
   wherein the switching controller controls the circuit switching unit such that the circuit switching unit is in the first state during waiting, and
   wherein the switching controller controls the circuit switching unit such that the circuit switching unit is in the second state during measurement.

10. A measuring method for measuring a current, the measuring method comprising:
    a transformation step of transforming a physical amount into the current with a physical amount transformer;
    a supplying step of supplying an output current transformed in the transformation step to a power supply circuit during waiting by controlling a circuit switching unit configured to switch between a first state and a second state into the first state, the first state constituting a circuit inputting an output of a measuring circuit into the power supply circuit, the second state constituting a circuit directly inputting the output of the measuring circuit into the physical amount transformer; and
    a measuring step of measuring the output current transformed in the transformation step during the period other than the waiting by controlling the circuit switching unit into the second state,
    wherein the circuit switching unit is provided on a current output terminal side of the measuring circuit.

11. The measuring apparatus according to claim 5,
    wherein the switching controller puts the circuit switching unit into the first state during the waiting by putting the first and second switching elements into a non-conduction state, and wherein the switching controller puts the circuit switching unit into the second state during the measurement by putting the first and second switching elements into a conduction state.

12. The measuring apparatus according to claim 5, wherein the first and second switching elements comprise an n-type or p-type FET or a bipolar transistor.

13. The measuring apparatus according to claim 6, wherein the first and second switching elements comprise an n-type or p-type FET or a bipolar transistor.

14. The measuring apparatus according to claim 2, wherein the physical amount transformer is constructed with a current transformer configured to take out a current passed through a power line while transforming the current with a predetermined current transformation ratio.

15. The measuring apparatus according to claim 3, wherein the physical amount transformer is constructed with a current transformer configured to take out a current passed through a power line while transforming the current with a predetermined current transformation ratio.

16. The measuring apparatus according to claim 4, wherein the physical amount transformer is constructed with a current transformer configured to take out a current passed through a power line while transforming the current with a predetermined current transformation ratio.

17. The measuring apparatus according to claim 5, wherein the physical amount transformer is constructed with a current transformer configured to take out a current passed through a power line while transforming the current with a predetermined current transformation ratio.

18. The measuring apparatus according to claim 6, wherein the physical amount transformer is constructed with a current transformer configured to take out a current passed through a power line while transforming the current with a predetermined current transformation ratio.

19. The measuring apparatus according to claim 7, wherein the physical amount transformer is constructed with a current transformer configured to take out a current passed through a power line while transforming the current with a predetermined current transformation ratio.

* * * * *